US008543103B2

(12) United States Patent  (10) Patent No.: US 8,543,103 B2
Qi et al.  (45) Date of Patent: *Sep. 24, 2013

(54) METHOD AND SYSTEM FOR CONDUCTING HEARING AID COMPATIBILITY TESTING OF A MOBILE COMMUNICATION DEVICE

(75) Inventors: Yihong Qi, Waterloo (CA); Ying Tong Man, Waterloo (CA); Perry Jarmuszewski, Waterloo (CA); Daoud S. Attayi, Waterloo (CA); Paul Gerard Giles Cardinal, Waterloo (CA)

(73) Assignee: BlackBerry Limited, Waterloo, Ontario (CA)

(*) Notice: Subject to any disclaimer, the term of this patent is extended or adjusted under 35 U.S.C. 154(b) by 0 days.

This patent is subject to a terminal disclaimer.

(21) Appl. No.: 13/610,944

(22) Filed: Sep. 12, 2012

(65) Prior Publication Data

US 2013/0005274 A1  Jan. 3, 2013

Related U.S. Application Data

(63) Continuation of application No. 11/613,769, filed on Dec. 20, 2006, now Pat. No. 8,301,133.

(51) Int. Cl.
*H04W 24/00* (2009.01)
(52) U.S. Cl.
USPC ........... 455/423; 455/424; 455/425; 455/300; 455/67.11; 455/115.1; 343/851; 343/873; 343/700 R
(58) Field of Classification Search
USPC  455/423–425, 575.5, 90.3, 300, 67.11–67.16, 455/115.1–115.4, 226.1–226.4; 343/851, 343/873, 700 R
See application file for complete search history.

(56) References Cited

U.S. PATENT DOCUMENTS

| | | | |
|---|---|---|---|
| 5,610,519 | A | 3/1997 | Hankui et al. |
| 6,525,657 | B1 | 2/2003 | Wojcik |
| 6,587,677 | B1 | 7/2003 | Hombach et al. |
| 8,301,133 | B2 | 10/2012 | Qi et al. |
| 2004/0102694 | A1 | 5/2004 | Iyama et al. |
| 2004/0235541 | A1 | 11/2004 | Iwai et al. |
| 2006/0204002 | A1 | 9/2006 | Moller et al. |
| 2008/0261584 | A1 | 10/2008 | Qi et al. |

FOREIGN PATENT DOCUMENTS

| | | |
|---|---|---|
| CA | 2550158 A1 | 3/2003 |
| CA | 2611223 A1 | 6/2008 |
| EP | 1455193 A2 | 9/2004 |

(Continued)

OTHER PUBLICATIONS

Reply Brief as filed on U.S. Appl. No. 11/738,590, dated Jan. 4, 2013.

(Continued)

*Primary Examiner* — Wayne Cai
(74) *Attorney, Agent, or Firm* — Bereskin & Parr LLP/S.E.N.C.R.L., s.r.l.

(57) ABSTRACT

Embodiments relate to a system for conducting hearing aid compatibility testing of a mobile communication device. The system comprises: a simulated hand for supporting the mobile communication device during the testing; a probe; and a processor. The processor is configured to cause the probe to be positioned in a sequence of positions in proximity to the mobile communication device relative to an audio output component of the mobile communication device during the testing and to determine a field strength of a field radiated by the mobile communication device at the sequence of positions based on an output of the probe at each position.

15 Claims, 8 Drawing Sheets

(56) References Cited

FOREIGN PATENT DOCUMENTS

| EP | 1936394 A1 | 6/2008 |
| EP | 1986453 B1 | 7/2009 |
| WO | 2004048949 A1 | 6/2004 |

OTHER PUBLICATIONS

"Hearing Aid Compatibility (HAC) Extension Kit for DASY4 According to ANSI-PC63.19," Accessed at www.dasy4.com/hac_rf.htm, as early as Sep. 15, 2006.

"DASY5 SAR," Accessed at www.dasy4.com/dasy5_sar.htm, as early as Sep. 15, 2006.

"Homogeneous tissue-equivalent phantom hand, suitable for mobile phone radiation pattern testing," Accessed at http://www.sam-phantom.com, as early as Dec. 12, 2006.

Moller et al., "Hand Phantom and Measurement System for Repeatable RF Measurements," CTIA ERP Ad-Hoc Working Group, Apr. 2, 2006.

Erdem Ofli and Niels Kuster, "Proposal for Generic Hand Phantoms," CTIA ERP Ad-Hoc Working Group, Apr. 2, 2006.

Berger, "Compatibility Between Hearing Aids and Wireless Devices", Electronics Industries Forum of New England 1997, New York, NY, USA, IEEE, May 6, 1997.

Anonymous, ALSAS 10 Universal Integrated SAR Measurement System for Compliance . . . Oct. 22, 2004, http://www.aprel.com/pdf/alsas_10u_Sept24_04.pdf, retreived 2007-25-29.

Seabury. "A Update on SAR Standards and the Basic Requirements for SAR Assessment", Apr. 6, 2005, http://ets-lindgren.com/pdf/sar_lo.pdf, retrieved May 29, 2007.

Ludmarki et al., "A Solid Hand Phantom for Mobile Phones and Results of Measurements . . . ", Antennas and Propagation Society Symposium, vol. 1, Jun. 20, 2004, pp. 719-722.

Ogawa et al., "A High-Precision Real Human Phantom for EM Evaluation of Handheld . . . ", IEEE Antennas and Propagation Society Symposium, vol. 1 of 4, Jul. 8, 2001, pp. 68-71.

Pedersen et al., "Radiation Efficiency of Handheld Phones", 2000 IEEE 51st Vehicular Technology Conference, vol. 2 of 3, Conf. 51, May 15, 2000, pp. 1381-1385.

Anonymous, "CTIA Certification: Test Plan for Hearing Aid Compatibility", Aug. 2006, http://files.ctia.org/pdf/CTIA_HearingAidComp_TestPlan_Rev1.0.pdf, retrieved May 29, 2007.

Fransson, Marie "SAR Simulations with SEMCAD, a new FDTD software package for computational electrodynamics", Master Thesis by Marie Fransson in cooperation with Moteco AB, Nov. 2001.

Extended European Search Report issued on corresponding European Patent Application 06126738.1, dated Jun. 19, 2007.

Extended European Search Report, issued on European Application. No. 07106743.3, dated Sep. 21, 2007.

International Search Report and Written Opinion (App. No. PCT/CA2008/000789), dated Aug. 13, 2008.

Intent to Grant , European Communication under Rule 71(3) EPC. Application No. 07106743.3, dated Nov. 28, 2008.

Response as filed on corresponding European Patent Application 06126738.1, dated Jan. 25, 2008.

Examination Report, "Communication pursuant to Article 94(3) EPC" issued on issued on corresponding European Patent Application 06126738.1, dated Sep. 19, 2008.

Response as filed on corresponding European Patent Application 06126738.1, dated Jan. 20, 2009.

European Communication: "Summons to Attend oral proceedings pursuant to Rule 115(1) EPC" issued on corresponding European Patent Application No. 06126738.1, dated Jun. 8, 2010.

Written Submissions as filed on corresponding European Patent Application 06126738.1, dated Nov. 5, 2010.

European Communication: "Decision to Refuse European Patent Application" issued on corresponding European Patent Application 06126738.1, dated Dec. 23, 2010.

Grounds of Appeal as filed on corresponding European Patent Application 06126738.1, dated Apr. 28, 2011.

Office Action issued on copending U.S. Appl. No. 11/738,590, dated Mar. 2, 2010.

Office Action (Final) issued on copending U.S. Appl. No. 11/738,590, dated Jun. 25, 2010.

Request for Continued Examination ("RCE") as filed on copending U.S. Appl. No. 11/738,590, dated Sep. 21, 2010.

Office Action (1stAfterRC—MadeFinal) issued on copending U.S. Appl. No. 11/738,590, dated Mar. 16, 2012.

Notice of Panel Decision from Pre-Appeal Brief Review issued on copending U.S. Appl. No. 11/738,590, dated Aug. 1, 2012.

Examiner's Answer issued on issued on copending U.S. Appl. No. 11/738,590, dated Nov. 9, 2012.

Office Action issued on parent U.S. Appl. No. 11/738,590, dated Jun. 25, 2009.

Response filed on on parent U.S. Appl. No. 11/738,590, dated Oct. 19, 2009.

Office Action (final) issued on parent U.S. Appl. No. 11/738,590, dated Dec. 8, 2009.

Response filed on parent U.S. Appl. No. 11/738,590, dated Feb. 2, 2010.

Advisory Action issued on parent U.S. Appl. No. 11/738,590, dated Feb. 16, 2010.

Request for Continued Examination ("RCE") as filed on parent U.S. Appl. No. 11/738,590, dated May 19, 2010.

Office Action (after RCE) issued on parent U.S. Appl. No. 11/738,590, dated Jan. 17, 2012.

Response as filed on parent U.S. Appl. No. 11/738,590, dated Mar. 2, 2012.

Advisory Action issued on parent U.S. Appl. No. 11/738,590, dated Mar. 8, 2012.

Notice of Appeal as filed on parent U.S. Appl. No. 11/738,590, dated Apr. 17, 2012.

Appeal Brief as filed on parent U.S. Appl. No. 11/738,590, dated Jun. 4, 2012.

Notice of Allowance as issued on parent U.S. Appl. No. 11/738,590, dated Aug. 9, 2012.

Canadian Office Action issued on Canadian Application No. 2,611,223, dated Oct. 25, 2010.

Canadian Office Action (2nd) issued on Canadian Application No. 2,611,223, dated Oct. 10, 2012.

METHOD AND SYSTEM FOR CONDUCTING HEARING AID COMPATIBILITY TESTING OF A MOBILE COMMUNICATION DEVICE

CROSS REFERENCE TO RELATED APPLICATION

This application is a continuation of prior U.S. patent application Ser. No. 11/613,769 filed on Dec. 20, 2006, the entirety of which is hereby incorporated by reference.

TECHNICAL FIELD

The described embodiments relate to methods and systems for conducting hearing aid compatibility (HAC) testing of a mobile communication device. In particular, the methods and systems involve the use of a simulated hand to support the mobile communication device during the testing.

BACKGROUND

With the increased prevalence of mobile communication devices, it has recently become necessary to monitor interference of mobile communication devices with other systems, such as hearing aids. As mobile communication devices are commonly held to the ear, it is possible that, where the person holding the device has a hearing aid inserted into the person's ear, the mobile communication device may interfere with signals in the hearing aid and degrade its performance.

One existing arrangement for HAC testing comprises a stand for supporting the mobile communication device during the testing and a reference grid or locater. The stand has vice-like grips for gripping the mobile communication device during the testing, and a base positionable on a flat surface. The position of the grips is movable relative to the base about several axes and/or planes of movement. The material of the stand is selected to have a dielectric constant that is low.

In use, the mobile communication device is fixed between the grips of the stand and positioned so as to have it's audio output located at a certain position with respect to the reference grid, following which the electric or magnetic field strength is measured at particular locations around the audio output while the mobile communication device is transmitting a signal.

Measurements obtained during HAC testing have a certain amount of inherent uncertainty. Reducing this HAC measurement uncertainty can be important for enforcing the compatibility standard and helping manufacturers in device development.

BRIEF DESCRIPTION OF THE DRAWINGS

The embodiments are described in further detail below, by way of example, with reference to the accompanying drawings, in which.

DETAILED DESCRIPTION

The described embodiments relate generally to methods and systems for conducting HAC testing of a mobile communication device. The embodiments generally make use of a simulated hand to support the mobile communication device during the testing.

Certain embodiments relate to a system for conducting hearing aid compatibility testing of a mobile communication device. The system comprises: a simulated hand for supporting the mobile communication device during the testing; a probe; and a processor. The processor is configured to cause the probe to be positioned in a sequence of positions in proximity to the mobile communication device relative to an audio output component of the mobile communication device during the testing and to determine a field strength of a field radiated by the mobile communication device at the sequence of positions based on an output of the probe at each position.

The field may comprise an electric and/or magnetic field and the probe may be configured for electric and/or magnetic field sensing. A reference member may be positioned proximate the mobile communication device and on an opposite side of the mobile communication device to the simulated hand, wherein the reference member may comprise indicia to indicate at least one of the sequence of positions relative to a marker aligned with the audio output component.

The simulated hand may comprise a material having dielectric properties approximating average dielectric properties of a human hand.

The system may further comprise a communication unit responsive to the processor to communicate with the mobile communication device and to cause the mobile communication device to radiate the field.

A simulated head may be positioned proximate the mobile communication device and on an opposite side of the mobile communication device to the simulated hand, wherein the simulated head may have a passage for receiving the probe therethrough. The passage may be dimensioned to permit movement of the probe in the sequence of positions. The passage may have a closed end and the simulated head may have at the closed end a reference member, wherein the reference member may comprise indicia to indicate at least one of the sequence of positions.

The simulated head may comprise a material having dielectric properties approximating average dielectric properties of a human head. The material may be a liquid.

The system may further comprise a probe positioning system responsive to the processor to position the probe in the sequence of positions.

Other embodiments relate to use of a simulated hand for conducting hearing aid compatibility testing of a mobile communication device, in which the simulated hand supports the mobile communication device during testing.

Other embodiments relate to use of a simulated hand and a simulated head for conducting hearing aid compatibility testing of a mobile communication device during the testing. The simulated hand supports the mobile communication device and the simulated head may be positioned on an opposite side of the mobile communication device to the simulated hand during testing. In such embodiments, the simulated head has a passage to receive a probe therethrough. An end of the passage may be positioned relative to an audio output component of the mobile communication device.

Other embodiments relate to a method for conducting hearing aid compatibility testing of a mobile communication device. The method comprises: positioning the mobile communication device in supported relation to a simulated hand; causing a probe to be positioned in a sequence of positions in proximity to the mobile communication device relative to an audio output component of the mobile communication device; and determining a field strength of a field radiated by the mobile communication device at the sequence of positions based on an output of the probe at each position.

The positioning may comprise positioning the mobile communication device proximate a reference member so that the reference member is located on an opposite side of the mobile communication device to the simulated hand. The reference member may indicate the sequence of positions relative to a marker aligned with the audio output component.

The positioning may further comprise positioning the mobile communication device proximate a simulated head so that the simulated head is located on an opposite side of the mobile communication device to the simulated hand. The simulated head may have a passage for receiving the probe. The passage may be dimensioned to permit movement of the probe in the sequence of positions. The field may comprise an electric and/or magnetic field and the determining may comprise electric and/or magnetic field sensing.

Figure 1:
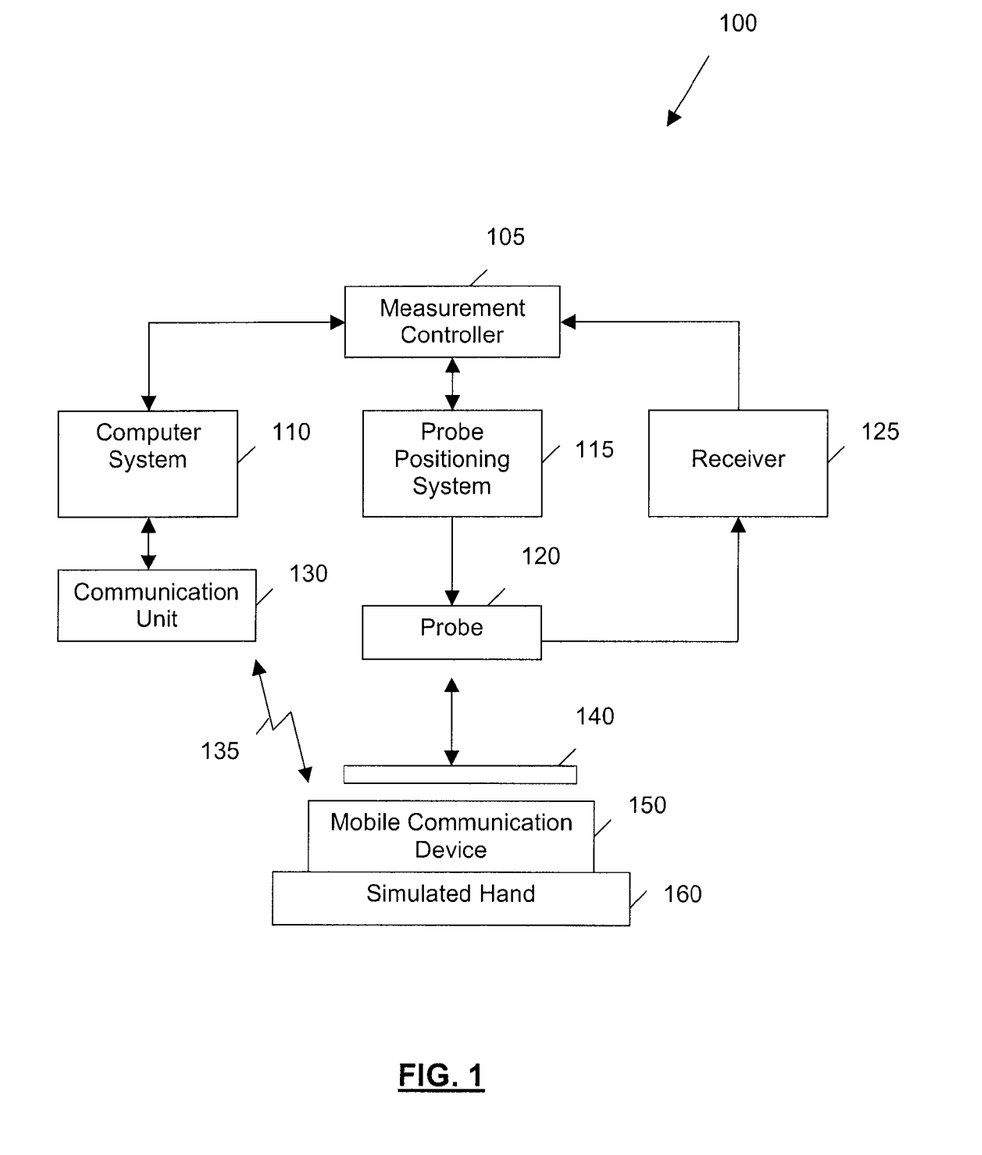
FIG. 1 is a block diagram of a system for conducting HAC testing of a mobile communication device.

Referring now to FIG. 1, there is shown a system 100 for conducting HAC testing of a mobile communication device 150. System 100 comprises a measurement controller 105, computer system 110, probe positioning system 115, probe 120, receiver 125, communication unit 130, reference member 140 and simulated hand 160.

Measurement controller 105 communicates with probe positioning system 115 to cause probe 120 to be positioned relative to the mobile communication device 150 in a sequence of spaced locations relative to reference member 140 when reference member 140 has mobile communication device 150 positioned at a particular location relative thereto. An output of probe 120 is connected to receiver 125. Receiver 125 receives a measurement signal from the output of the probe 120 and the receiver 125 conditions the measurement signal as necessary before providing a corresponding output to measurement controller 105. Measurement controller 105 receives the output of probe 120 via receiver 125 and determines the field strength of the electric or magnetic field sensed by probe 120 based on that output.

Because the electric field strength is proportional to the power and the power is proportional to the square of the voltage in a sensing circuit of the probe 120, the field strength can be calculated, given a sensed voltage or current through a known resistance in the sensing circuit in probe 120. Accordingly, measurement controller 105 can determine the field strength of a field emitted from mobile communication device 150 based on a voltage output, for example, from the sensing circuit in probe 120.

In order to conduct the HAC testing, it is necessary to have mobile communication device 150 transmit a signal in the same way that it would during wireless communication over a cellular connection. Accordingly, measurement controller 105 interfaces with computer system 110 to cause communication unit 130 to initiate wireless communication with mobile communication device 150. In effect, communication unit 130 is caused to "place a call" to mobile communication device 150. The call made from communication unit 130 to mobile communication device 150 is established over a communication link 135, which persists during the HAC testing. Communication unit 130 is configured to transmit a particular test signal to mobile communication device 150 to cause it to transmit at maximum power, pursuant to HAC testing protocols.

Probe positioning system 115 may be a robotic arm suitable for precision movement and positioning of a probe tip 128 (FIG. 2) relative to reference member 140.

In an alternative embodiment of system 100, receiver 125 may be omitted if probe 120 is configured to interface directly with measurement controller 105 to provide its output signal thereto. Alternatively, the signal conditioning functions of receiver 125 may be integrated with probe 120 or with probe positioning system 115.

In another alternative embodiment, measurement controller 105 may interface directly with communication unit 130 without going through computer system 110 to cause communication link 135 to be established. In such an embodiment, measurement controller 105 may communicate separately with computer system 110 for user interface purposes, for example.

Computer system 110 may provide a user interface (not shown) including a display and suitable software for displaying results of the HAC testing to an interested person. Further, computer system 110 may comprise a suitable memory (not shown) or database (not shown) for storing the results of the HAC testing.

Figure 2:
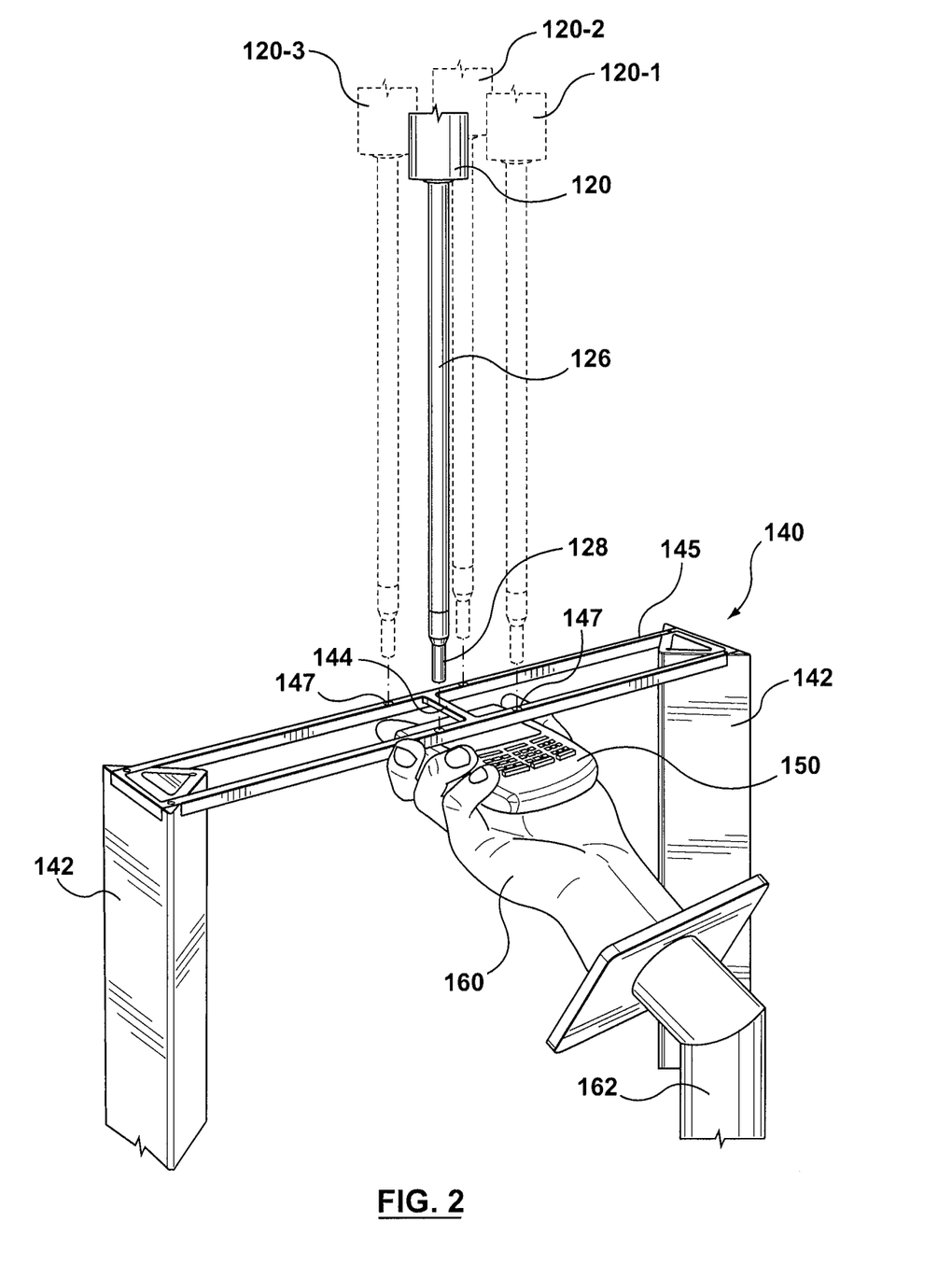
FIG. 2 is a perspective view of a part of an embodiment of the system of FIG. 1.

During the HAC testing, mobile communication device 150 is supported in relation to reference member 140 by simulated hand 160. This supporting relation of simulated hand 160 to mobile communication device 150 mimics the use of a human hand to hold the mobile communication device 150 during its operation (i.e. as if the mobile communication device 150 were being held up to the human ear). Accordingly, the simulated hand is formed in a fixed position for holding the mobile communication device so that the thumb lies along a right side of the device (as viewed from the front), the palm supports the back of the device and the third, fourth and fifth digits support the left side of the device. An example form of simulated hand 160 is shown in FIG. 2, which is described further below.

The simulated hand 160 is formed of a synthetic material having dielectric properties, including the dielectric constant and conductivity of the material, that are substantially constant throughout the material and that approximate the average dielectric properties of a human hand, including tissue and bones. For example, the simulated hand 160 may have a dielectric constant in the range of about 37 for low band frequencies to about 46 for high band frequencies. The conductivity of the simulated hand 160 may be about 0.85 s/m for low band frequencies up to about 2.46 s/m for high band frequencies.

An example of a suitable simulated hand is the hand phantom available from Microwave Consultants Ltd., London, England. Suitable simulated hands may be made to conform to CTIA and FCC standards for testing of wireless devices.

One example of a measurement controller 105 is the commercially available DASY4 system marketed by Schmid & Partner Engineering AG. This system can also be used for specific absorption rate (SAR) testing and includes suitable software for performing the testing (including controlling probe positioning system 115) and suitable equipment to serve as probe 120. A suitable probe positioning system 115 may comprise a robot arm manufactured by STAUBLI Unimation, for example.

Mobile communication device 150 may be any suitable device capable of wireless transmission of signals in a cellular network. The mobile communication device 150 may comprise additional features and functions, such as provisioning for electronic mail communication, or other functions to be performed on the device or with the aid of a wirelessly accessed network.

Referring now to FIG. 2, a part of system 100 is shown in further detail. As shown in FIG. 2, reference member 140 comprises a reference plate 145 disposed generally horizontally and supported at opposite ends via supports 142. The reference plate 145 is sufficiently long, and supports 142 are sufficiently spaced from each other, that there is adequate space under reference plate 145 for mobile communication device 150 to be moved and positioned as desired.

Reference plate 145 has indicia 147 disposed on an upper face thereof for indicating positions at which the probe tip 128 is to be positioned during the HAC testing. The indicia 147 may be arranged at the corners of a 5 cm×5 cm square, for example. Alternative non-square arrangements of indicia 147 may be employed, if desired. The indicia 147 are positioned so as to be equally spaced from a central marker 144 on reference plate 145. Marker 144 is positioned at the lateral and longitudinal center of reference plate 145 and comprises an indicator to allow alignment of the audio output component of mobile communication device 150 with the marker 144. Marker 144 may comprise a notch, ridge, line or crosshairs, for example.

As shown in FIG. 2, mobile communication device 150 is supported by simulated hand 160. In turn, simulated hand 160 is connected to and supported by a support stand 162 that is movable through at least one, and optionally two or three, degrees of freedom. Support stand 162 enables suitable positioning of mobile communication device 150 relative to reference member 140 when supported by simulated hand 160.

FIG. 2 shows probe 120 positioned so as to have a shaft 126 pending downwardly toward probe tip 128 at its lower end, with probe tip 128 being positioned vertically above one of the indicia 147 on reference plate 145. In this position, probe 120 can be used to determine a field strength of a field emitted from mobile communication device 150. Although FIG. 2 shows probe tip 128 being separated from reference plate 145 by a few centimeters, the exact vertical separation may be controlled by probe positioning system 115 according to HAC testing requirements.

Following use of probe 120 to sense a field strength at one position (aligned with one of the indicia 147), probe 120 is subsequently moved in a horizontal plane by probe positioning system 115 to a further three positions 120-1, 120-2 and 120-3 associated with the other indicia 147 on reference plate 145. In the embodiment illustrated in FIG. 2, the indicia 147 are provided at each of the four positions above which probe tip 128 is to be positioned for conducting the HAC testing. In an alternative embodiment, only one indicia 147 may be required for position calibration of the first sensing position. Subsequent probe sensing positions 120-1, 120-2 and 120-3 can then be obtained by pre-programmed precise movement of probe 120 by probe positioning system 115 in a square pattern, treating the first sensing position as the origin in an x-y plane.

Figure 3:
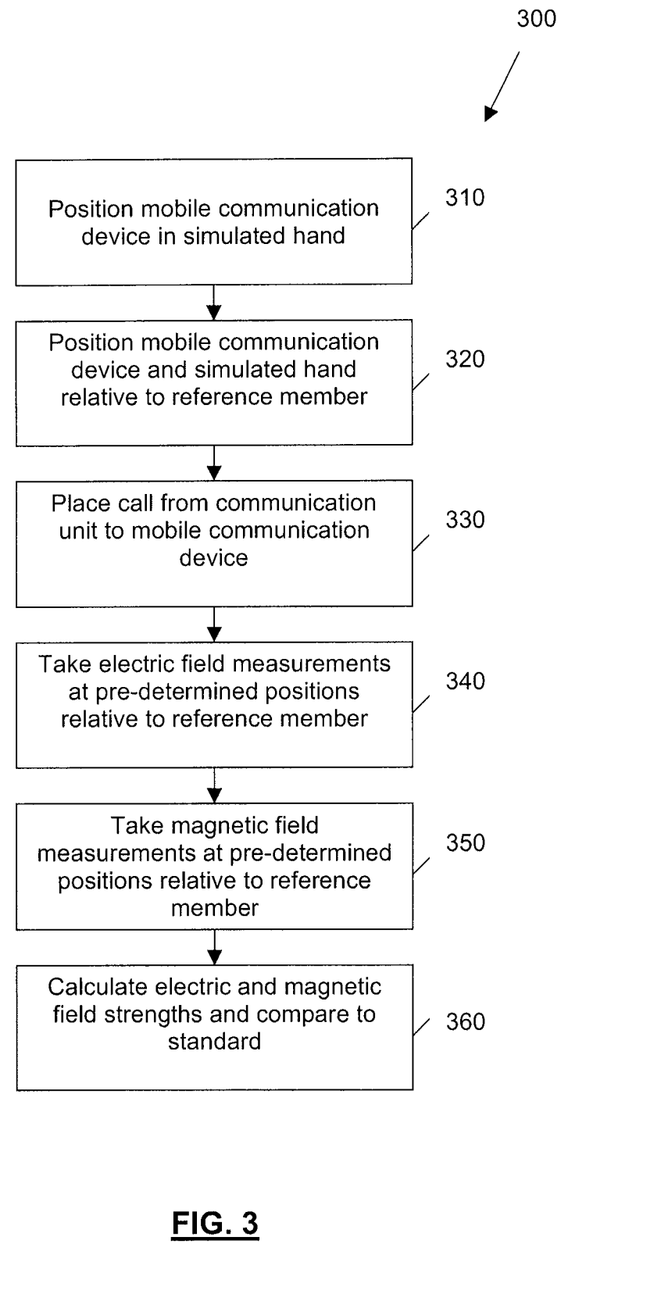
FIG. 3 is a flowchart of a method for conducting HAC testing of a mobile communication device.

Referring now to FIG. 3, a method 300 of conducting HAC testing of mobile communication device 150 is described in further detail. Method 300 begins at step 310, at which mobile communication device 150 is positioned in simulated hand 160 in the manner depicted in FIG. 2.

As much as possible, the mobile communication device 150 is to be positioned in simulated hand 160 in a manner that mimics the way that mobile communication device 150 would be held in a user's hand when its audio output (speaker) is held to the user's ear. For example, mobile communication device 150 may be held in simulated hand 160 so that the palm of simulated hand 160 supports the backside (i.e. the face opposite to the display screen and dialing keys) of mobile communication device 150, while a thumb of simulated hand 160 is positioned along a right-side of mobile communication device 150 and the third, fourth and fifth digits of the simulated hand 160 are positioned along and/or around the left side of mobile communication device 150. The second digit (pointer finger) may be positioned over, around or along a top edge of mobile communication device 150, proximally adjacent the audio output, or it may be positioned along the left side of the device with the third, fourth and fifth digits. This example assumes that simulated hand 160 is a right hand. It will be understood that an opposite orientation of the digits of simulated hand 160 relative to mobile communication device 150 may be employed for a left-handed version of simulated hand 160. Simulated hand 160 may be formed differently to accommodate different ways of holding mobile communication device 150, for example because of different user interface features and/or device shapes or sizes.

At step 320, mobile communication device 150 is positioned relative to reference member 140, as shown in FIG. 2, by moving simulated hand 160 and support stand 162 so that the audio output of mobile communication device 150 is positioned directly and closely beneath marker 144. For accuracy of field strength measurements, the audio output of mobile communication device 150 should not be spaced from marker 144 by more than a predetermined distanced determined according to HAG testing standards and may be about 1 cm, for example. Steps 310 and 320 may be performed manually or automatically.

At step 330, measurement controller 105 causes communication unit 130, either directly or via computer system 110, to place a call (link 135) to mobile communication device 150, thereby creating wireless connection between communication unit 130 and mobile communication device 150. In placing the call to mobile communication device 150, communication unit 130 transmits a test signal recognized by mobile communication device 150 to cause it to transmit a communication signal at full power.

At step 340, measurement controller 105 causes probe positioning system 115 to move probe 120 to predetermined positions (as shown in FIG. 2) relative to marker 144 in sequence and to take electric field measurements at those positions. Such electric field measurements are received at measurement controller 105 directly from probe 120 or via receiver 125.

At step 350, step 340 is repeated, but for taking magnetic field measurements at the predetermined positions, rather than electric field measurements. Thus, at step 350, measurement controller 105 causes probe positioning system 115 to move probe 120 to predetermined positions relative to marker 144 in sequence and to take magnetic field measurements at those positions. Such magnetic field measurements are received at measurement controller 105 directly from probe 120 or via receiver 125.

At step 360, measurement controller 105 calculates the electric and magnetic field strengths at the predetermined positions, based on the measurements obtained at steps 340 and 350. Measurement controller 105 then compares the calculated field strengths to a standard to determine whether mobile communication device 150 meets the HAC testing requirements.

Figure 4:
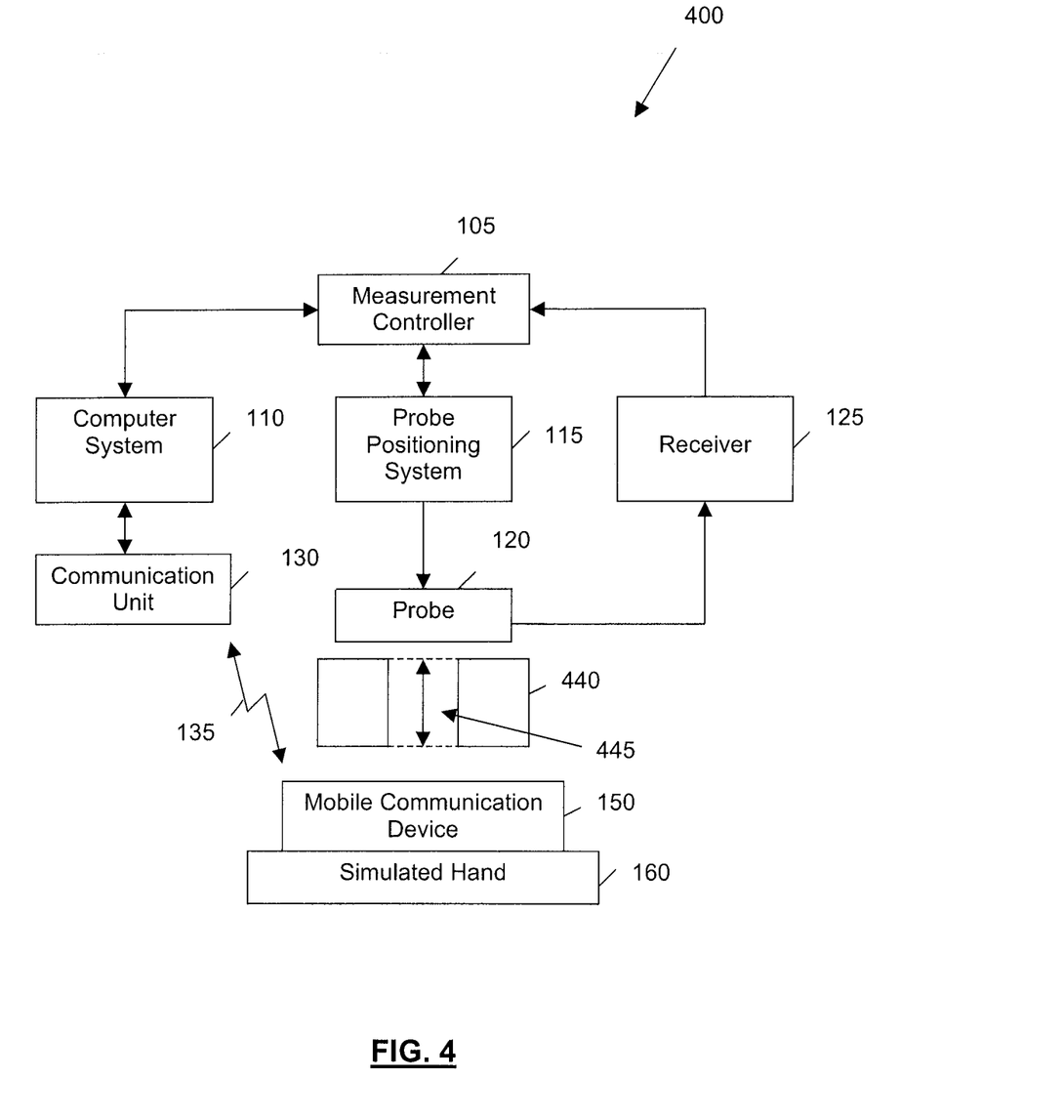
FIG. 4 is a block diagram of a further system for conducting HAC testing of a mobile communication device.

Referring now to FIG. 4, there is shown a system 400 for conducting HAC testing according to further embodiments. System 400 is identical to system 100, except that reference member 140 is replaced by a simulated head 440. Accordingly, for succinctness of description, only the differences between systems 100 and 400 are described below.

Simulated head 440 is shown and described in further detail in relation to FIGS. 5 to 7 below. Simulated head 440 is situated above mobile communication device 150 while the mobile communication device 150 is supported below by simulated hand 160. Simulated head 440 has a passage 445 therethrough for allowing probe 120 to be positioned close to mobile communication device 150 to perform appropriate HAC measurements. Simulated head 440 is similar to existing commercially available arrangements employed for SAR testing, except that such commercially available SAR testing arrangements do not provide a passage, such as passage 445, through the simulated head.

Figure 5:
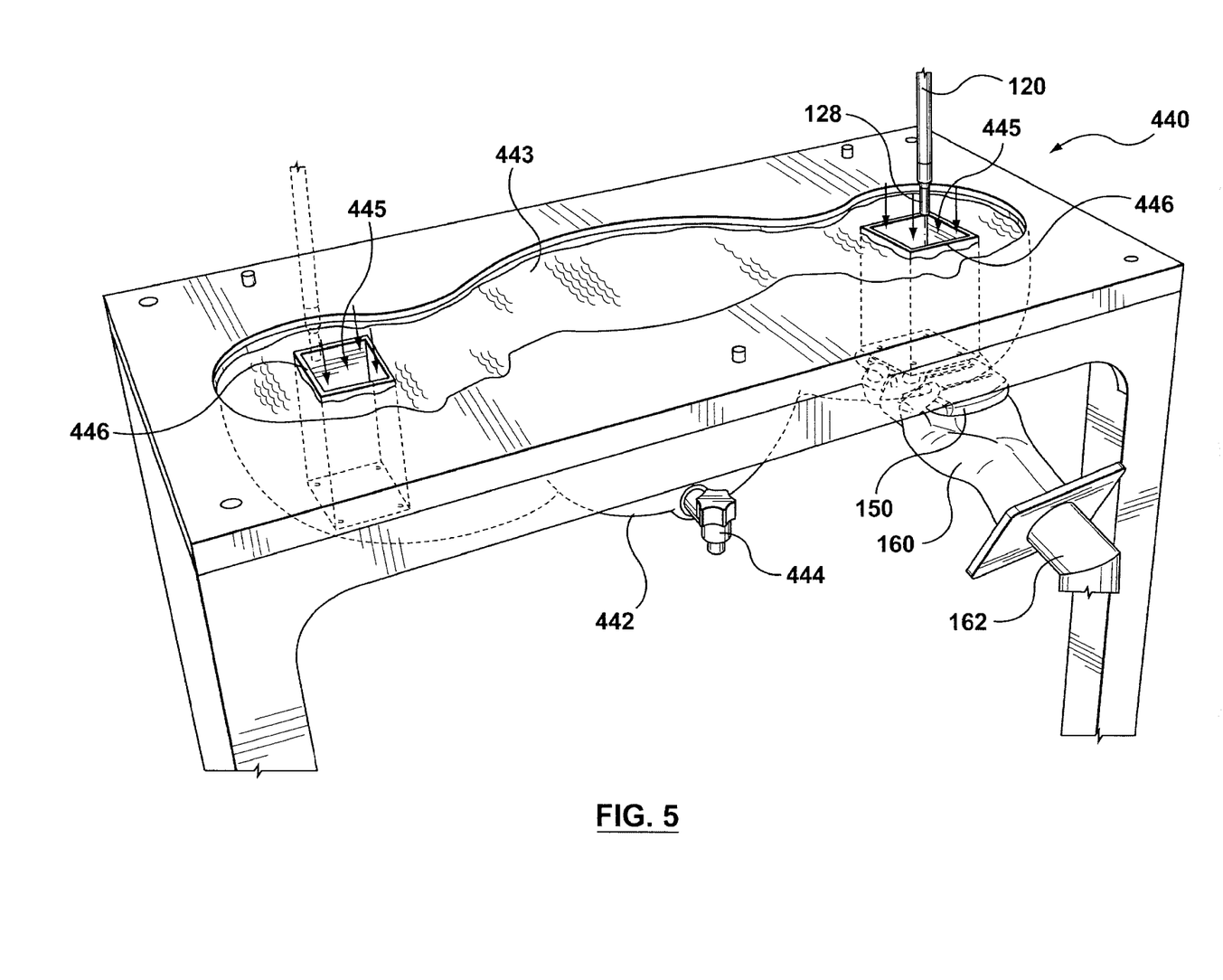
FIG. 5 is a perspective view of a part of an embodiment of the system of FIG. 4, showing a mobile communication device in relation to a simulated head and a simulated hand.
Figure 6:
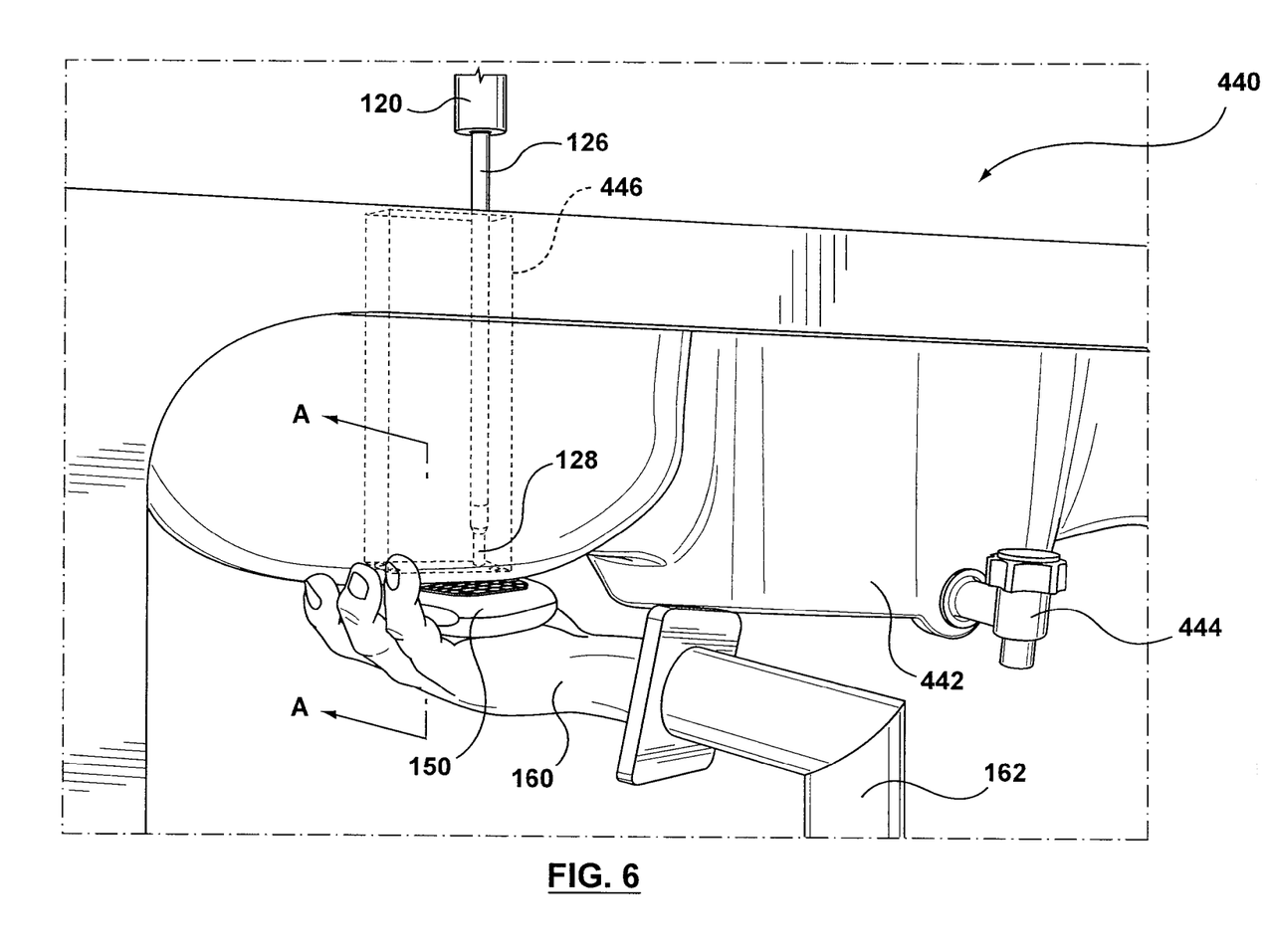
FIG. 6 is a further perspective view of a part of an embodiment of the system of FIG. 4, showing a mobile communication device in relation to a simulated head and a simulated hand.
Figure 7:
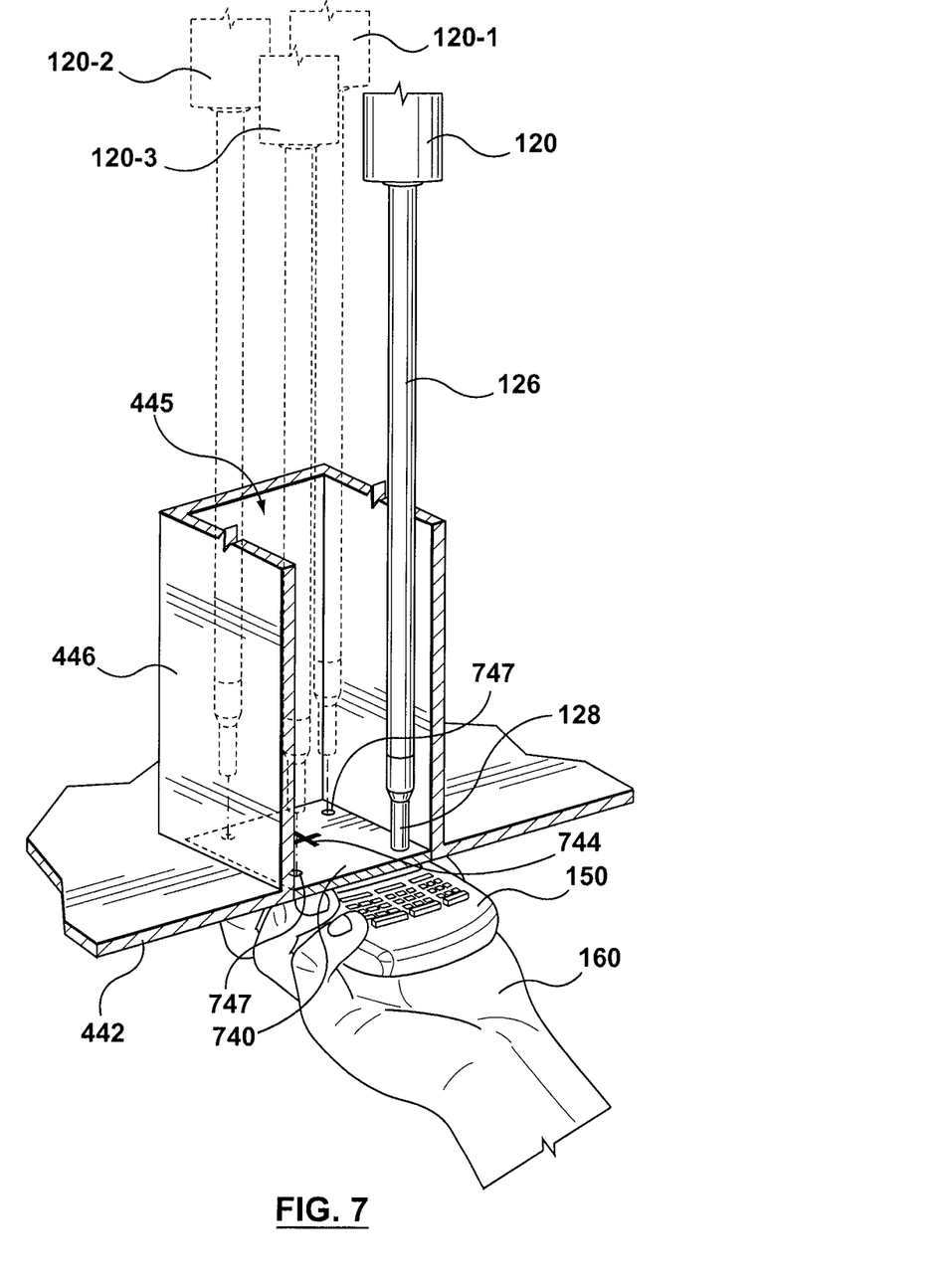
FIG. 7 is a partial cross-sectional cutaway of the simulated head shown in FIG. 6, taken along line A-A.

Referring now to FIGS. 5 to 7, simulated head 440 is described in further detail. Simulated head 440 comprises a specially shaped tank 442 for containing a volume of liquid 443. Tank 442 is supported by a table-like structure so as to be stable and stationary. Tank 442 has walls contoured so as to resemble, at opposed longitudinal ends of tank 442, a left and right head shape, as viewed upwardly from below tank 442. Tank 442 may be open to the air where its walls meet with a planar top surface of the table-like structure. Alternatively, tank 442 may be enclosed so that liquid 443 is covered, while allowing probe 120 to access the passage 445 at each longitudinal end of the tank 442. Liquid 443 may be drained from tank 442 by a drainage valve 444, as required.

Liquid 443 may be any suitable liquid having substantially uniform dielectric properties, including dielectric constant and conductivity, that approximate the average dielectric properties of a human head, including bone and other tissue. Examples of such suitable liquids include mixtures of de-ionized water, sugar, salt, cellulose, preservative and diethylene-glycol monobutyl ether (DGBE). The particular characteristics and proportions of such ingredients of liquids suitable for simulating head tissue will be known to those skilled in the art of SAR testing, as will suitable methods of preparation of such liquids.

Tank 442 may hold approximately 25 liters of head tissue simulating liquid 443. Target dielectric properties for the head tissue simulating liquid 443 at frequencies between 300 MHz and 3 GHz are defined in the standards for compliance testing, such as CENELEC EN50361, Supplement C to OET Bulletin 65, IEEE P1528, for example.

The passageways 445 for the left and right head portions of simulated head 440 are defined by a hollow rectangular wall 446 extending upwardly from a bottom surface of tank 442. Wall 446 has a height sufficient to exceed the depth of the liquid 443 in tank 442 so that none of liquid 443 can enter passage 445. Walls 446 are formed of a suitable plastic or other material having a substantially uniform dielectric constant closely approximating the dielectric constant of liquid 443.

During HAC testing using simulated head 440, mobile communication device 150 is positioned at a lower end of passage 445, while supported by simulated hand 160. Thus, mobile communication device 150 is positioned between (a left or right side of) simulated head 440 and simulated hand 160 in a manner that mimics the position of mobile communication device 150 when held to a person's ear.

As shown in FIG. 5, mobile communication device 150 and simulated hand 160 are positionable relative to simulated head 440 by positioning and adjustment of support stand 162, to which simulated hand 160 is connected or attached.

As shown in FIG. 5, probe 120 is positionable relative to mobile communication device 150 by lowering probe 120 down into passage 445 so that probe tip 128 can be positioned at specific positions relative to the audio output of mobile communication device 150.

FIG. 6 shows a partial side view in perspective of simulated head 440, with mobile communication device 150 positioned supportingly in simulated hand 160 beneath a right head portion of simulated head 440. Probe 120 is shown in FIG. 6 as extending within passage 445 downwardly toward mobile communication device 150, so that probe tip 128 is positioned relative to the audio output of mobile communication device 150.

FIG. 7 shows a partial cutaway perspective view of simulated head 440, taken along line A-A of FIG. 6. As shown in FIG. 7, tank 442 has a reference plate 740 located at a bottom end of passage 445. Reference plate 740 is positioned in a horizontal plane and serves substantially the same function as reference plate 145 of reference member 140. Reference plate 740 comprises indicia 747 disposed on an upper face thereof for indicating positions at which the probe tip 128 is to be positioned during the HAC testing. The indicia 747 may be arranged at the corners of a 5 cm by 5 cm square, for example. Accordingly, walls 446 defining passage 445 define a rectanguloid volume sized to accommodate movement of shaft 126 within passage 445 to the four positions shown in FIG. 7 (including positions 120-1, 120-2 and 120-3). Thus, walls 446 may define an inner surface having a horizontal cross-section of 6.5 to 7 cm, assuming that shaft 126 has a radius of 1 cm or less.

Indicia 747 are positioned on reference plate 740 so as to be equally spaced from a central marker 744. Marker 744 is positioned at the lateral and longitudinal center of reference plate 740 and comprises an indicator to allow alignment of the audio output component of mobile communication device 150 with the marker 744. Marker 744 may comprise a notch, ridge, line or crosshairs, for example. As shown in FIG. 7, the marker 744 comprises crosshairs.

In an alternative embodiment of simulated head 440, reference plate 740 may be omitted and reference member 140 may be used for alignment purposes, instead of reference plate 740.

Figure 8:
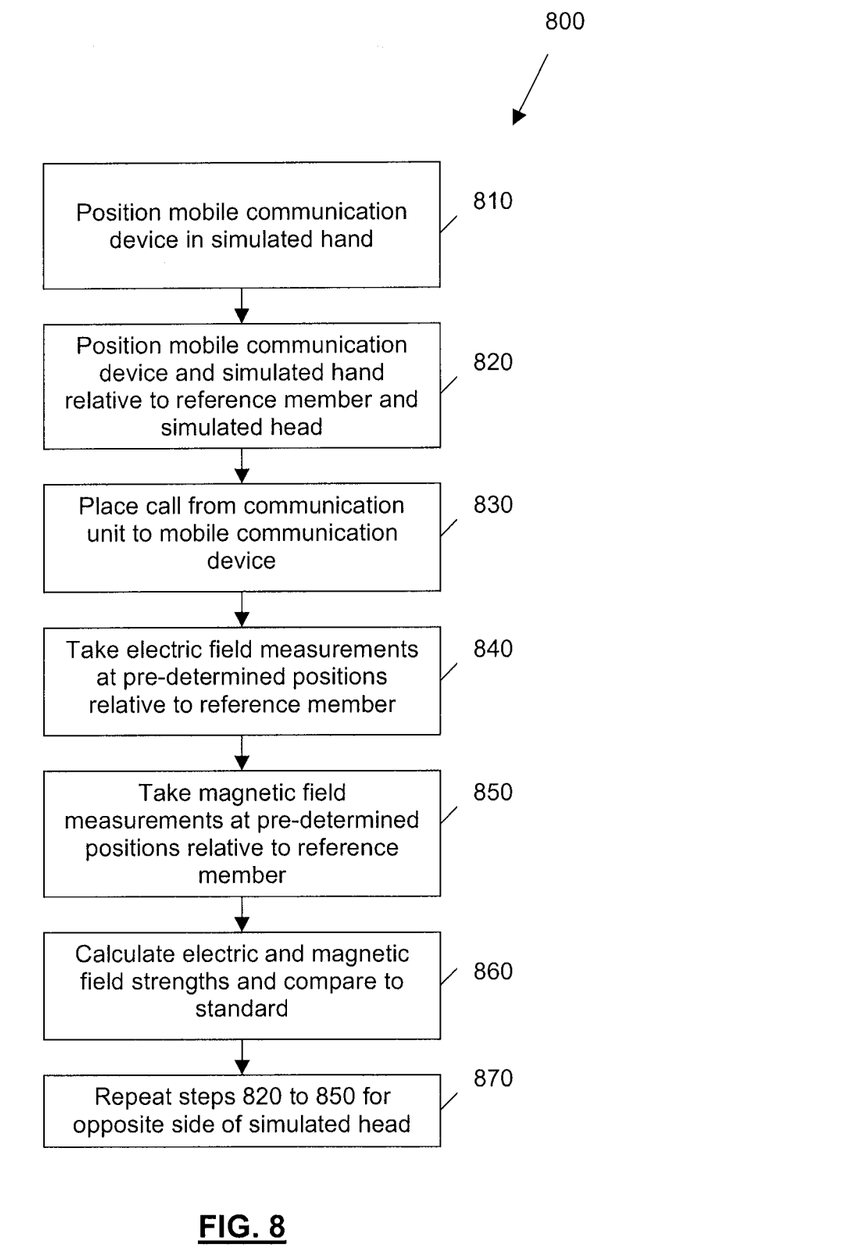
FIG. 8 is a flowchart of a further method of conducting HAC testing of a mobile communication device.

Referring now to FIG. 8, a method 800 of conducting HAC testing using simulated head 440 is described. Method 800 begins at step 810, at which mobile communication device 150 is positioned in simulated hand 160 in the manner depicted in FIGS. 5 to 7. As much as possible, the mobile communication device 150 is to be positioned in simulated hand 160 in a manner that mimics the way that mobile communication device 150 would be held in a user's hand when its audio output (speaker) is held to the user's ear. Mobile communication device 150 may be held in simulated hand 160 in the manner described in relation to FIG. 3. Simulated hand 160 is illustrated as a right hand. It will be understood that an opposite orientation of the digits of simulated hand 160 relative to mobile communication device 150 may be employed for a left-handed version of simulated hand 160.

At step 820, mobile communication device 150 is positioned relative to reference plate 740 of one side of simulated head 440, as shown in FIG. 7, by moving simulated hand 160 and support stand 162 so that the audio output of mobile communication device 150 is positioned directly and closely beneath marker 744. For accuracy of field strength measurements, the audio output of mobile communication device 150 should not be spaced from marker 744 by more than a predetermined distance of, say about 1 cm. Steps 810 and 820 may be performed manually or automatically.

At step 830, measurement controller 105 causes communication unit 130, either directly, or via computer system 110, to place a call to mobile communication device 150, thereby creating a wireless connection (link 135) between communication unit 130 and mobile communication device 150. In placing the call to mobile communication device 150, communication unit 130 transmits a test signal recognized by mobile communication device 150 to cause it to transmit a communication signal at full power.

At step 840, measurement controller 105 causes probe positioning system 115 to move probe 120 to predetermined positions (as shown in FIG. 7) relative to marker 744 in sequence and to take electric field measurements at those positions. Such electric field measurements are received at measurement controller 105 directly from probe 120 or via receiver 125.

At step 850, step 840 is repeated, but for taking magnetic field measurements at the predetermined positions, rather than electric field measurements. Thus, at step 850, measurement controller 105 causes probe positioning system 115 to move probe 120 to predetermined positions relative to marker 744 in sequence and to take magnetic field measurements at those positions. Such magnetic field measurements are received at measurement controller 105 directly from probe 120 or via receiver 125.

At step 860, measurement controller 105 calculates the electric and magnetic field strengths at the predetermined positions, based on the measurements obtained at steps 840 and 850. Measurement controller 105 then compares the calculated field strengths to a standard to determine whether mobile communication device 150 meets the HAC testing requirements.

At step 870, steps 820 to 850 are repeated for the opposite (left or right) side of simulated head 440 to the side (right or left) under which mobile communication device 150 was initially positioned at step 820.

Use of simulated head 440 in addition to simulated hand 160 in conducting HAC testing may reduce uncertainty levels associated with the measurements obtained by the HAC testing.

While the above description provides examples of embodiments, it will be appreciated that some features and/or functions of the described elements are susceptible to modification without departing from the spirit and principles of operation of the described embodiments. Accordingly, what has been described is intended to be illustrative of the invention and non-limiting.

The invention claimed is:

1. A system for conducting hearing aid compatibility testing of a mobile communication device, comprising:
    a simulated hand for supporting the mobile communication device during the testing;
    a probe;
    a processor configured to cause the probe to be positioned in a sequence of positions in proximity to the mobile communication device relative to an audio output component of the mobile communication device during the testing and to determine a field strength of a field radiated by the mobile communication device at the sequence of positions based on an output of the probe at each position; and
    a reference member comprising indicia to indicate at least one of the sequence of positions relative to a marker aligned with the audio output component.

2. The system of claim 1, wherein the field comprises an electric field and the probe is configured for electric field sensing.

3. The system of claim 1, wherein the field comprises a magnetic field and the probe is configured for magnetic field sensing.

4. The system of claim 1, wherein the simulated hand comprises a material having dielectric properties approximating average dielectric properties of a human hand.

5. The system of claim 1, further comprising a communication unit responsive to the processor to communicate with the mobile communication device and to cause the mobile communication device to radiate the field.

6. The system of claim 1, further comprising a simulated head positioned proximate the mobile communication device and on an opposite side of the mobile communication device to the simulated hand, wherein the simulated head has a passage for receiving the probe therethrough, the passage being dimensioned to permit movement of the probe in the sequence of positions.

7. The system of claim 6, wherein the passage has a closed end and the simulated head has at the closed end a reference member, wherein the reference member comprises indicia to indicate at least one of the sequence of positions.

8. The system of claim 6, wherein the simulated head comprises a material having a dielectric constant approximating an average dielectric constant of a human head.

9. The system of claim 8, wherein the material is a liquid.

10. The system of claim 1, further comprising a probe positioning system responsive to the processor to position the probe in the sequence of positions.

11. A method for conducting hearing aid compatibility testing of a mobile communication device, comprising:
    positioning the mobile communication device in supported relation to a simulated hand;
    causing a probe to be positioned in a sequence of positions in proximity to the mobile communication device relative to an audio output component of the mobile communication device;
    wherein a reference member indicates the sequence of positions relative to a marker aligned with the audio output component; and
    determining a field strength of a field radiated by the mobile communication device at the sequence of positions based on an output of the probe at each position.

12. The method of claim 11, wherein the positioning comprises positioning the mobile communication device proximate the reference member so that the reference member is located on an opposite side of the mobile communication device to the simulated hand.

13. The method of claim 11, wherein the positioning further comprises positioning the mobile communication device proximate a simulated head so that the simulated head is located on an opposite side of the mobile communication device to the simulated hand, wherein the simulated head has a passage for receiving the probe, the passage being dimensioned to permit movement of the probe in the sequence of positions.

14. The method of claim 11, wherein the field comprises an electric field and the determining comprises electric field sensing.

15. The method of claim 11, wherein the field comprises a magnetic field and the determining comprises magnetic field sensing.

* * * * *